(12) United States Patent  
Oswald et al.

(10) Patent No.: US 8,809,236 B2
(45) Date of Patent: Aug. 19, 2014

(54) METHOD FOR MANUFACTURING A HTS COATED TAPE WITH LASER BEAM CUTTING

(75) Inventors: Johannes Oswald, Miltenberg (DE); Bernhard Oswald, Miltenberg (DE); Thomas Reis, Kleinheubach (DE); Alexander Rutt, Aschaffenburg (DE); Alexander Usoskin, Hanau (DE)

(73) Assignees: Oswald Elektromotoren GmbH, Miltenberg (DE); Bruker HTS GmbH, Hanau (DE)

( * ) Notice: Subject to any disclaimer, the term of this patent is extended or adjusted under 35 U.S.C. 154(b) by 373 days.

(21) Appl. No.: 13/396,614

(22) Filed: Feb. 15, 2012

(65) Prior Publication Data

US 2012/0211475 A1 Aug. 23, 2012

(30) Foreign Application Priority Data

Feb. 18, 2011 (EP) .................................. 11154950

(51) Int. Cl.  
*H01L 39/24* (2006.01)

(52) U.S. Cl.  
CPC ..................................... *H01L 39/24* (2013.01)  
USPC ............. 505/430; 505/412; 505/500; 29/599; 427/62; 427/63; 427/271; 427/404; 219/121.69

(58) Field of Classification Search  
CPC ................................. H01L 39/24; B23K 26/00  
USPC ......... 505/412, 430, 500; 29/599; 427/62, 63, 427/256, 264, 271, 402, 404; 264/400, 430, 264/482; 174/125.1; 250/492.1; 219/121.69  
See application file for complete search history.

(56) References Cited

U.S. PATENT DOCUMENTS

| | | |
|---|---|---|
| 5,902,499 A | 5/1999 | Richerzhagen |
| 7,728,258 B2 | 6/2010 | Richerzhagen |
| 7,774,035 B2 | 8/2010 | Lee |
| 2003/0129814 A1 | 7/2003 | Mizukoshi |
| 2007/0179063 A1 | 8/2007 | Malozemoff |
| 2007/0228025 A1 | 10/2007 | Horn |
| 2007/0278195 A1 | 12/2007 | Richerzhagen |
| 2008/0113870 A1 | 5/2008 | Lee |
| 2009/0242525 A1* | 10/2009 | O'Brien et al. .......... 219/121.68 |
| 2012/0214673 A1* | 8/2012 | Usoskin ........................ 505/211 |

FOREIGN PATENT DOCUMENTS

| | | |
|---|---|---|
| EP | 0 375 578 | 6/1990 |
| GB | 2 229 125 | 9/1990 |
| WO | WO 2005/096322 | 10/2005 |

* cited by examiner

*Primary Examiner* — Samuel M Heinrich  
(74) *Attorney, Agent, or Firm* — Paul Vincent

(57) ABSTRACT

A method for manufacturing a high temperature superconductor (=HTS) coated tape (20), with the following steps: preparation of a substrate tape (1), deposition of at least one buffer layer (2), deposition of an HTS film (3), deposition of a metallic protection layer (35) on the HTS film (3) and deposition of a metallic shunt layer (36) is characterized in that, prior to deposition of the metallic shunt layer (36), the partially prepared coated tape (10) undergoes a laser beam cutting in order to provide a desired tape form, wherein the laser beam cutting is applied together with a gas flow and/or a liquid flow (23). The method reduces the loss of critical current and reduces or avoids a deterioration of the critical temperature in a HTS coated tape due to tape cutting.

18 Claims, 3 Drawing Sheets

METHOD FOR MANUFACTURING A HTS COATED TAPE WITH LASER BEAM CUTTING

This application claims Paris Convention priority of EP 11 154 950.7 filed Feb. 18, 2011 the complete disclosure of which is hereby incorporated by reference.

BACKGROUND OF THE INVENTION

The invention relates to a method for manufacturing of a high temperature superconductor (=HTS) coated tape, with the following steps:
a) preparation of a substrate tape,
b) deposition of at least one buffer layer,
c) deposition of an HTS film,
d) deposition of a metallic protection layer on the HTS film,
e) deposition of a metallic shunt layer.

A layered HTS structure, comprising a substrate, a buffer layer, an HTS layer, a capping layer and a stabilizer layer, or a corresponding method for its manufacturing, respectively, are known from U.S. Pat. No. 7,774,035 B2.

The invention deals with methods for manufacturing of high temperature superconducting (HTS) coated tapes and may be employed, in particular, in the fields of building of motors, magnets, generators, energy transmission and energy distribution.

Superconductors are used when large electric currents shall be transported or applied with low ohmic losses. High temperature superconductors, having a critical temperature high enough such that cooling may be done with liquid nitrogen (boiling point at atmospheric pressure about 77K), are inexpensive in cooling. However, due to their ceramic properties, HTS devices are usually manufactured on substrates (HTS coated conductors); in particular, there are tape type substrates that typically offer some mechanical flexibility to HTS coated conductors. For HTS coated tapes, it is known to deposit the HTS film on a buffer layer deposited on the substrate, in order to achieve a beneficial HTS grain orientation needed for high critical currents. The HTS film is typically covered by a protection layer (also called capping layer) of a noble metal in order to avoid corrosion, and a shunt layer (also called stabilization layer) is deposited on top.

A cutting of HTS coated conductors is needed in many application segments e.g. for manufacturing of planar electrical circuits, de-coupled filaments, HF inductances, etc.

Generally, cutting techniques known from semiconductor technology may be used with HTS coated conductors. For example, water jet techniques (also combined with gas streams) are known from DE 44 18 845 C1, EP 0 375 578 A1 or US 2007/0278195 A1. Further known methods are electro-erosion or mechanical slitting.

However, when applying these techniques to HTS coated conductors, partial or complete damage of the HTS structure results. To the inventor's knowledge, this is caused via a spreading the damage area outside the "treated" area, what may be caused in some cases by spreading of cracks, or the penetration of liquids or vapours which are aggressive regarding the HTS or buffer layers. Such deterioration results in a severe reduction of the overall critical current (with a deterioration degree depending on materials employed) and a decrease in the critical temperature of the HTS film.

It is also known to cut workpieces such as silicon wafers by means of a laser beam, in particular in combination with liquid flow, compare U.S. Pat. No. 7,728,258 B2 or Even when applying laser beam cutting, HTS coated conductors are subject to a considerable deterioration of their critical currents due to the cutting.

US 2008/0113870 A1 describes a laser beam cutting process for preparing metal filaments. HTS material and a metallic protection layer are deposited on the prepared metal filaments subsequently.

It is the object of the invention to reduce the loss of the critical current and to reduce or avoid a deterioration of the critical temperature in a HTS coated tape due to tape cutting.

SUMMARY OF THE INVENTION

This object is achieved, in accordance with the invention, by a method as introduced in the beginning, characterized in that, before deposition of the metallic shunt layer, the partially prepared coated tape undergoes a laser beam cutting in order to provide a desired tape form,
wherein the laser beam cutting is applied together with a gas flow and/or a liquid flow.

According to the invention, the application of the laser beam cutting is done at a manufacturing stage when the deposition of the shunt layer (stabilization layer) has not yet taken place. The inventors found that the shunt layer may enhance the spreading of damage from the immediate cutting zone during cutting. Accordingly, when depositing (at least) the shunt layer after the laser beam cutting has taken place, the shunt layer may no longer spread damage during cutting. As a result, the cut parts of the partially prepared coated tape may retain or achieve, respectively, higher critical currents and higher critical temperatures as compared to HTS coated tapes cut after shunt layer deposition. Further, a better time stability and a longer lifetime of the HTS coated tape during its functional application may be achieved.

The laser beam cutting must not take place immediately before the deposition of the metallic shunt layer; in particular, the deposition of the metallic protection layer may take place at least partially after the laser beam cutting (and before the deposition of the shunt layer). Note that the laser beam cutting may apply one laser beam or several laser beams at the same time which overlap in the cutting region.

According to the invention, the laser beam cuts the complete thickness of the partially prepared coated tape, including the substrate tape. Thus current paths provided by the substrate tape, in particular fault current (which appears when the HTS film is quenched under current that exceeds a critical threshold) paths through metallic substrates, may be defined by the cutting process.

The deposition of the metallic protection layer (typically consisting of Ag, Au or another precious metal or a precious metal alloy) also covers edges of the HTS layer, and typically covers the complete partially prepared coated tape (including the substrate tape). The deposition of the metallic shunt layer typically also covers the complete partially prepared coated tape.

The gas flow and/or liquid flow is preferably directed along the laser beam. Sometimes the liquid flow, as e.g. a liquid jet, serves as a guide for the laser beam by means of internal total reflection. The gas and/or liquid flow enhances the removal of material from the cutting region, in particular by providing a fast transport path for material removed and/or by etching properties of the gas or liquid material flow. Thus the material removal may be more gentle for the structure of the HTS coated conductor, which also helps in achieving a high critical current of the final HTS coated conductor.

In a preferred variant of the inventive method, a cross-sectional dimension of a laser beam applied at the laser beam cutting is in between 1 and 500 µm, preferably in between 10 and 100 µm. These dimensions have shown good results in practice, in particular resulting in low losses of critical current due to cutting. The laser beam wavelength is preferably from 0.5 to 3 µm. It is possible to apply a Re-based fiber laser (where Re denotes a rear earth element), or the laser beam may be transported within a liquid flow (liquid-jet guided laser beam). It is also possible to have a liquid flow being added to a gas flow. Further, a laser operating in a double pulse mode, wherein a first pulse activates higher optical absorption of the surface, and a second pulse serves for the tape cutting, may be applied.

In another advantageous variant, the partially prepared coated tape is transported during the laser beam cutting. Thus basically unlimited tape lengths may be cut at a small local cutting stage. Preferably, the transporting of the tape is smooth (continuous), and typically with a constant speed. The transport is typically "in-plane" with respect to the tape, with a 1D (linear) or 2D transport. Alternatively, transport and cutting may be provided with at least one interruption, and in particular with a multitude of cutting interruptions. In contrast, when the tape is stationary, the laser beam has to be moved.

In a highly preferred variant, a laser beam applied during the laser beam cutting is tilted relative to the plane normal of the partially prepared coated tape. The tilting may be in longitudinal and/or transversal direction with respect to the tape. By tilting, an improved quality of cutting edges (in particular rounded edges) may be achieved; the tilting may be performed either via beam tilting or via substrate tilting.

In a preferred further development of this variant, the tilted laser beam is provided in a plane which is perpendicular to the surface of the partially prepared coated tape and which contains the direction of the progress of the laser beam relative to the partially prepared coated tape during laser beam cutting. Then protrusions of tape material ("under etching" that may cause further delamination of some layers of HTS film in the HTS coated tape) is avoided.

An advantageous variant provides that the laser beam cutting is performed after deposition of the at least one buffer layer, in particular after deposition of the HTS layer. By this means, the deposition of the buffer layer(s) or the HTS layer, respectively, can be done for all later tape parts in common, simplifying and accelerating the method.

Further, in a preferred variant, the laser beam cutting is done before deposition of the metallic protection layer. Thus, adverse effects of the metallic protection layer during cutting, such as unwanted laser beam reflection, can be avoided. It is noted that in an alternative in accordance with the invention, the laser beam cutting may be done after deposition of the complete metallic protection layer, or after deposition of a part of the protection layer (see below).

A particularly preferred variant is characterized in that the deposition of the metallic protection layer is performed in at least two steps, and that the laser beam cutting is performed between the at least two steps of the deposition of the metallic protection layer. By this procedure, the HTS layer (which is below the metallic protection layer) is already protected against reactive environment by a part (i.e. some of the final layer thickness) of the protection layer when the laser beam cutting begins (which is typically accompanied by an aggressive/reactive environment for the entire partially prepared coated tape). In turn, the fresh edges resulting from the laser beam cutting process will still be protected by a further part of the protection layer after the laser beam cutting and before the deposition of the shunt layer (which typically comprises non-noble metal, often containing impurities, both of which may be reactive). Further advantageous is a variant wherein the manufacturing of the HTS coated tape comprises at least one additional step of annealing, in particular in an oxygen atmosphere. By the annealing step, tape characteristics may be altered or adapted.

In a preferred further development, the at least one annealing step is performed between or after the at least two steps of the deposition of the metallic protection layer. Thus properties of the HTS layer may be altered or adapted, in particular improving the critical current by introducing precious metal of the protection layer and/or oxygen at the grain boundaries of the HTS material.

In another advantageous variant, the laser beam cutting is done with an incidence of the laser beam from the side of the partially prepared coated tape which is opposite to the side where the at least one buffer layer and the HTS film are deposited. This laser beam cutting "from the back" is more gentle to the buffer layer and the HTS layer, and results in improved critical current, as compared to a cutting "from the top".

In an advantageous variant, the deposition of the metallic protection layer comprises a vacuum deposition process of a precious metal or precious metal alloy. This grants a high quality deposition, in particular low in impurities.

Another advantageous variant provides that the deposition of the metallic shunt layer comprises galvanic plating. This process is particularly simple and allows full coverage of the partially prepared coated tape without further measures. Note that the shunt layer is typically made of copper; in some cases shunt layers made of silver or gold or the like may be used.

Further preferred is a variant wherein a ratio R of a thickness TH of the substrate tape and a width WD of a cut of the partially prepared coated tape caused by the laser beam cutting is in the range of R=0.5 to R=80. In this parameter range of R=TH/WD, the critical current losses upon cutting have been found to be particularly low.

In a highly preferred variant, the gas flow and/or liquid flow is chemically active with respect to the substrate tape. This introduces a possibility of efficient local chemical removal of substrate tape material, namely via a chemical reaction which leads to a gaseous or liquid product ("etching"). Preferably, the gas flow and/or liquid flow is inert with respect to all other components of the partially prepared HTS coated tape.

Further advantages can be extracted from the description and the enclosed drawing. The features mentioned above and below can be used in accordance with the invention either individually or collectively in any combination. The embodiments mentioned are not to be understood as exhaustive enumeration, rather have exemplary character for the description of the invention.

The invention is shown in the drawing.

DESCRIPTION OF THE PREFERRED EMBODIMENT

The invention presents a novel method for manufacturing an HTS coated tape. It comprises processing of a substrate tape, deposition of at least one buffer layer, deposition of an HTS film, deposition of a metallic protection layer, deposition of a metallic shunt layer, and cutting of the tape in order to provide a desired tape form. The cutting of the tape is performed via laser beam cutting. Later technique is typically applied together with a liquid flow directed along the laser beam and guiding this beam towards the tape. In accordance with the invention, the laser beam cutting is applied in between processing steps prior to the deposition of the metallic shunt layer.

Figure 1A:
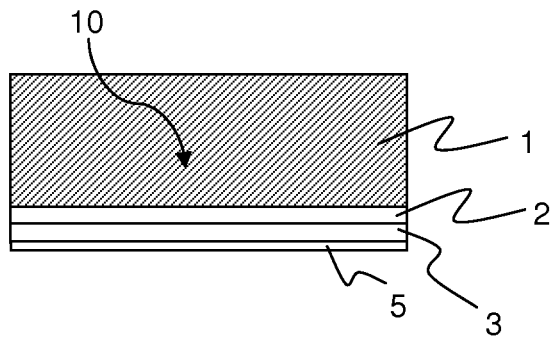
FIG. 1a schematically shows a partially prepared coated tape in a cross-sectional view taken perpendicular to the direction of tape extension, in accordance with the invention.
Figure 1B:
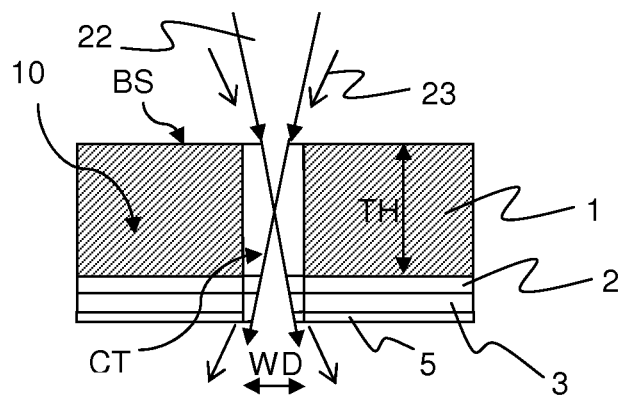
FIG. 1b shows the partially prepared coated tape of FIG. 1a during laser beam cutting, in accordance with the invention.
Figure 1C:
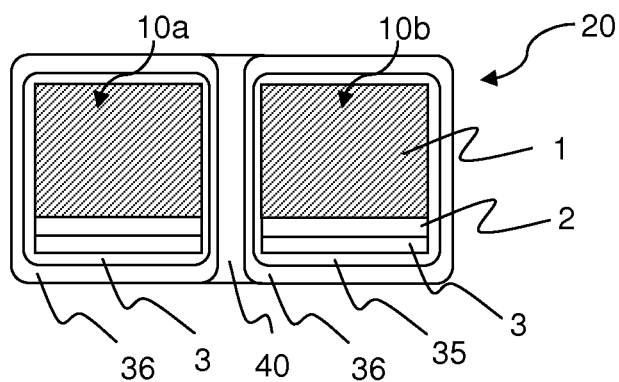
FIG. 1c shows the HTS coated tape resulting from the partially prepared coated tape of FIG. 1b after deposition of a shunt layer.

FIGS. 1a through 1c illustrate the steps of the inventive method by way of example.

On a substrate tape 1, a buffer layer 2 (or alternatively several buffer layers) is deposited. On top of the buffer layer 2, a HTS film 3 is deposited. Further, a first part 5 of a metallic protection layer is deposited on top of the HTS film 3. A partly prepared HTS coated tape 10 prepared in this way is illustrated in FIG. 1a.

Then laser beam cutting is performed, compare FIG. 1b. For this purpose, a laser beam 22, which is focussed roughly at the center of the thickness TH of the substrate tape 10 (note that the thickness of the buffer layer 2, the HTS film 3 and the part 5 of the metallic protection layer is typically negligible as compared to TH), is directed onto the partially prepared coated tape 10 from its side BS ("back side") facing away from the buffer layer 2 and the HTS layer 3. Along the laser beam 22, here a liquid flow 23 is directed into the cutting area. The laser beam 22 and the liquid flow 23 remove material from said cutting area, and a cut (or cutting gap) CT extending through the full thickness of the partially prepared coated tape 10 results. The diameter of the laser beam 22 in the cutting area roughly corresponds to the width WD of the cut CT.

After laser beam cutting, the deposition of the metallic protection layer is continued; this deposition is here done such that a precious metal is deposited from every side ("around") onto the (here two) parts 10a, 10b of the partially prepared coated tape 10, including sides facing the cut CT. In order to improve material deposition also in the cut CT, the parts 10a, 10b may be slightly bent apart from one side (e.g. at the backside BS, or subsequently from both sides), so the gap CT widens while the parts 10a, 10b exhibit a V-shaped cross-section. As a result, there is a metallic protection layer 35 completely covering the parts 10a, 10b. Subsequently, a metallic shunt layer 36 is deposited, also completely covering the two parts 10a, 10b from every side, compare FIG. 1c, which shows the final HTS coated tape 20 (here comprising two parts, connected via an end side bridge 40).

In a preferred embodiment, the following materials/dimensions are employed: A Cr—Ni stainless steel tape, 4 mm wide, 30 m long and 0.1 mm thick, is used as a substrate tape. The buffer layer comprises two dielectric sub-layers: the first sub-layer is based on yttria stabilized zirconia (1.5 μm thick) which is bi-axially textured via alternating beam assisted deposition (compare EP 1 693 905 B1 for details), and a so called cap layer comprising about 0.1 μm thick $CeO_2$ is the second sub-layer. The HTS film is based on $YBa_2Cu_3O_7$, and is about 1.5 μm thick. The $CeO_2$ second sub-layer and the HTS film are processed via pulsed laser deposition. The outer interface of the HTS film is coated with a metallic protection layer comprising a 2 μm thick layer of silver. The metallic shunt layer is made of 25 μm copper deposited via electroplating.

The laser cutting in this example is based on using an YAG laser with a wavelength of 1.06 μm, and an output power of 270 W. The partially prepared HTS coated tape was cut in longitudinal direction with a speed of 5 cm/sec provided via tape transportation. The water jet is installed here at 50 μm diameter.

In an HTS coated tape manufactured as above described, the integral (entire) critical current of the superconducting element (i.e. in the HTS layer) was reduced only by 3%, as compared to 25-30% deterioration by using the prior art techniques doing a cutting after the deposition of the shunt layer.

In more general cases, the cross-sectional dimension of the laser beam may be, in particular, between 1 and 500 μm (preferably from 10 to 100 μm). The laser may exhibit, in particular, a wavelength from 0.8 to 3 μm. The laser beam may be transported within liquid flow of different liquids such as water, ethyleneglycol, or alcohol. Liquid flow may be combined with a gas flow which may lead to further confinement of a cross-section of the laser beam in the cutting area. Laser methods based on double pulses, where the first pulse activates higher optical absorption of the surface, and the second pulse serves for the tape cutting, respectively, may be employed here as well.

The partially prepared HTS coated tape is transported relative to the laser beam during the laser beam cutting. For short HTS coated tapes and/or for 2D laser beam cutting, the laser beam together with liquid and/or gas flows may be moved across the stationary HTS coated tape. In case of long (more than 10 m) HTS coated tapes, preferably the tape is transported, and the laser beam as well as the liquid and/or gas flows are stationary or movable only to a limited extent (such as a up to 50 cm).

The relative transporting may be smooth, and typically with constant speed; transport is preferably an "in-plane" transport with respect to the tape (i.e. from left to right and up and down in the drawing plane of FIG. 2a, see below); 1D (linear) or 2D transport are possible. The transport and the laser cutting may be alternatively provided with at least one interruption; there may be a multitude of cutting interruptions during the processing if desired.

The substrate tapes applied in accordance with the invention are preferably made from an electrically conductive metal, such as stainless steel, typically sheeted to a thickness in the mm range or sub-mm range, thus offering some mechanical flexibility. The tape is, in general, much longer than wide (typically by a factor of at least 10; note that the production may be based on "endless" tape), and much wider than thick (typically by a factor of at least 10).

Figure 2A:
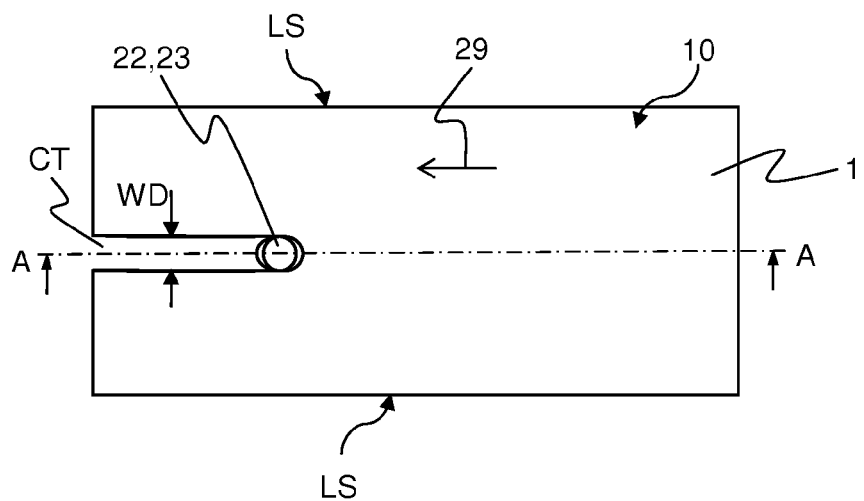
FIG. 2a shows a partially prepared coated tape, comprising a substrate, a buffer layer and a HTS layer, during laser beam cutting in accordance with the invention, in a top view.
Figure 2B:
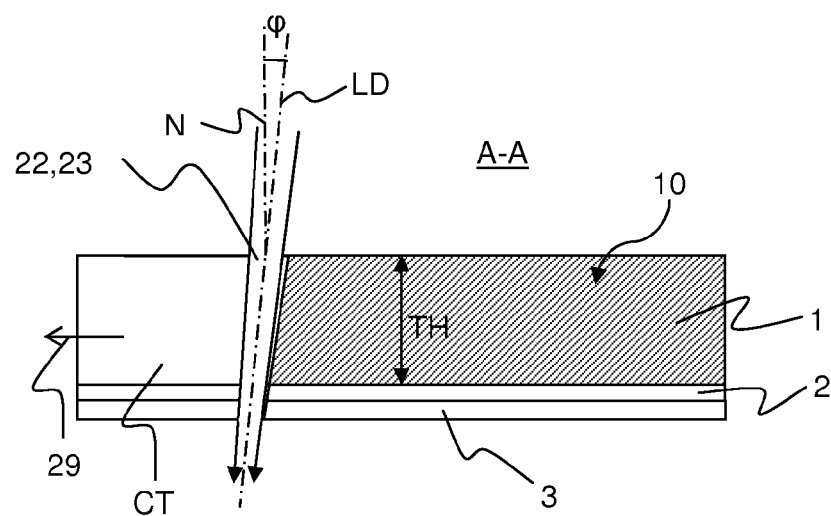
FIG. 2b shows schematically the partially prepared coated tape of FIG. 2a in a cross-sectional view taken parallel to the direction of tape extension.

FIGS. 2a (top view) and 2b (cross-sectional side view in the A-A plane, compare A-A line of FIG. 2a) illustrate the progress of laser beam cutting in accordance with the invention. The laser beam 22 and a liquid flow 23 are here stationary, and the partially prepared coated tape 10 is moved with a constant speed in direction 29 to the left in the FIGS. 2a and 2b. The laser beam 22, with its laser beam direction LD is slightly tilted by an angle φ against the plane normal N of the tape 10 within the longitudinal A-A plane (comprising the said plane normal N and the direction 29 of movement). φ is here about 10°, but other angles are also possible, with a preferred range of 5-30° for tilting angles in general. In the example shown, the laser beam 22 is, however, not tilted in a transverse plane (i.e. towards one of the long sides LS of the tape 10).

Further, in the example shown, the partially prepared coated tape 10 only comprises a substrate tape 1, a buffer layer 2 and a HTS layer 3, but no metallic protection layer so far; the latter will be deposited after the laser beam cutting is finished. The ratio R of the thickness TH of the substrate tape 1 and the width WD of the cut CT is here about R=4.

Figure 3A:
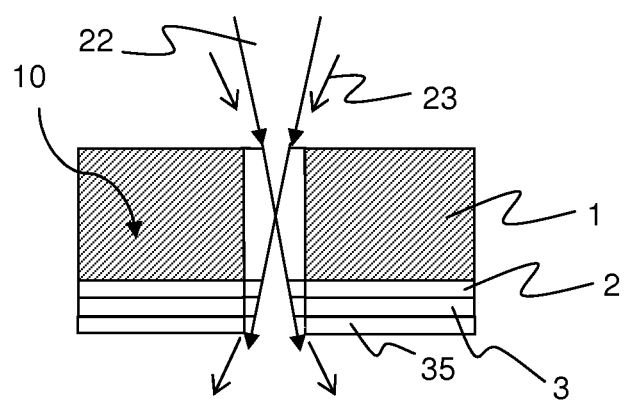
FIG. 3a schematically shows a partially prepared coated tape in a cross-sectional view taken perpendicular to the direction of tape extension during laser beam cutting, wherein a metallic protection layer has been completely deposited before laser beam cutting, in accordance with the invention.
Figure 3B:
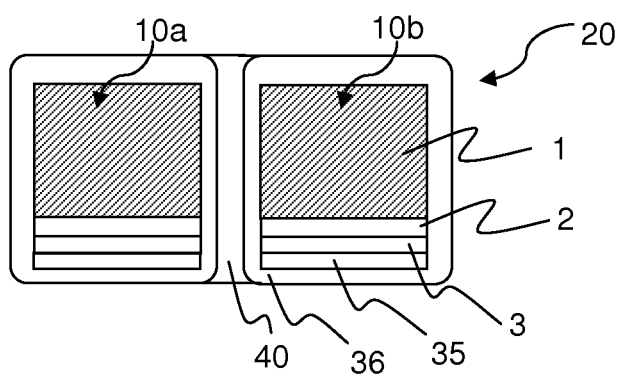
FIG. 3b shows the HTS coated tape resulting from the partially prepared coated tape of FIG. 3a after deposition of a shunt layer.

FIGS. 3*a* and 3*b* illustrate the inventive method in a further variant. In this variant, the metallic protection layer 35 has been completely deposited on the buffer layer 2 before the laser beam cutting begins (note that the metallic protection layer is, in the example shown, only a planar surface protection). Accordingly, the laser beam 22 also cuts through the complete metallic protection layer 35, compare FIG. 3*a*. After the laser beam cutting, only the metallic shunt layer 36 still has to be deposited. The deposited metallic shunt layer 36 here covers the parts 10*a*, 10*b* of the partially prepared coated tape completely ("around"). The resulting HTS coated tape 20 is shown in FIG. 3*b*.

We claim:

1. A method for manufacturing a high temperature superconductor (=HTS) coated tape, the method comprising the steps of:
   a) preparing a substrate tape;
   b) depositing at least one buffer layer onto the substrate tape;
   c) depositing an HTS film onto the at least one buffer layer;
   d) depositing a metallic protection layer onto the HTS film;
   e) depositing a metallic shunt layer; and
   f) cutting, prior to step e), a partially prepared coated tape using laser beam cutting to provide a desired tape form, wherein the laser beam cutting is applied together with a gas or liquid flow.

2. The method of claim 1, wherein a cross-sectional dimension of a laser beam applied during laser beam cutting is between 1 and 500 μm.

3. The method of claim 2, wherein a cross-sectional dimension of a laser beam applied during laser beam cutting is between 10 and 100 μm.

4. The method of claim 1, wherein the partially prepared coated tape is transported during the laser beam cutting.

5. The method of claim 1, wherein a laser beam applied during laser beam cutting is tilted relative to a plane normal of the partially prepared coated tape.

6. The method of claim 5, wherein a tilted laser beam is provided in a plane which is perpendicular to a surface of the partially prepared coated tape and which contains a direction of progress of the laser beam relative to the partially prepared coated tape during laser beam cutting.

7. The method of claim 1, wherein laser beam cutting is performed subsequent to deposition of the at least one buffer layer.

8. The method of claim 1, wherein laser beam cutting is performed subsequent to deposition of the HTS layer.

9. The method of claim 1, wherein laser beam cutting is done prior to deposition of the metallic protection layer.

10. The method of claim 1, wherein deposition of the metallic protection layer is performed in at least two steps, wherein laser beam cutting is performed between the at least two steps of the deposition of the metallic protection layer.

11. The method of claim 10, wherein manufacturing of the HTS coated tape comprises at least one additional step of annealing.

12. The method of claim 11, wherein annealing is performed in an oxygen atmosphere.

13. The method of claim 11, wherein the at least one annealing step is performed between or after the at least two steps of the deposition of the metallic protection layer.

14. The method of claim 1, wherein laser beam cutting is executed with an incidence of a laser beam from a side of the partially prepared coated tape which is opposite to a side where the at least one buffer layer and the HTS film are deposited.

15. The method of claim 1, wherein deposition of the metallic protection layer comprises a vacuum deposition process of a precious metal or precious metal alloy.

16. The method of claim 1, wherein deposition of the metallic shunt layer comprises galvanic plating.

17. The method of claim 1, wherein a ratio R of a thickness TH of the substrate tape and a width WD of a cut of the partially prepared coated tape caused by laser beam cutting is in a range of R=0.5 to R=80.

18. The method of claim 1, wherein the gas flow or liquid flow is chemically active with respect to the substrate tape.

\* \* \* \* \*